(12) United States Patent
Aanegola et al.

(10) Patent No.: US 7,224,000 B2
(45) Date of Patent: May 29, 2007

(54) LIGHT EMITTING DIODE COMPONENT

(75) Inventors: Srinath K. Aanegola, Broadview Heights, OH (US); James T. Petroski, Parma, OH (US); Emil Radkov, Euclid, OH (US); Stanton E. Weaver, Jr., Northville, NY (US)

(73) Assignee: Lumination, LLC, Valley View, OH (US)

( * ) Notice: Subject to any disclaimer, the term of this patent is extended or adjusted under 35 U.S.C. 154(b) by 78 days.

(21) Appl. No.: 10/831,862

(22) Filed: Apr. 26, 2004

(65) Prior Publication Data

US 2005/0239227 A1  Oct. 27, 2005

Related U.S. Application Data

(63) Continuation-in-part of application No. PCT/US03/027363, filed on Aug. 29, 2003.

(60) Provisional application No. 60/407,426, filed on Aug. 30, 2002.

(51) Int. Cl.
*H01L 29/22* (2006.01)
*H01L 29/227* (2006.01)
*H01L 27/15* (2006.01)
*H01L 29/267* (2006.01)
*H01L 29/24* (2006.01)

(52) U.S. Cl. ............... 257/98; 257/79; 257/81; 257/100; 257/E51.18; 257/E33.001

(58) Field of Classification Search ............ 257/79, 257/81, 98, 100, E51.18, E33.001; 438/22, 438/25–28
See application file for complete search history.

(56) References Cited

U.S. PATENT DOCUMENTS

| | | | |
|---|---|---|---|
| 5,526,455 A * | 6/1996 | Akita et al. | 385/93 |
| 5,632,551 A * | 5/1997 | Roney et al. | 362/485 |
| 5,812,717 A * | 9/1998 | Gilliland | 385/93 |
| 5,962,971 A | 10/1999 | Chen | |
| 6,234,648 B1 | 5/2001 | Borner et al. | |
| 6,294,800 B1 | 9/2001 | Duggal et al. | |
| 6,335,548 B1 | 1/2002 | Roberts et al. | |
| 6,410,940 B1 | 6/2002 | Jiang et al. | |
| 6,429,583 B1 | 8/2002 | Levinson et al. | |
| 6,472,765 B1 | 10/2002 | Sano et al. | |
| 6,498,355 B1 * | 12/2002 | Harrah et al. | 257/99 |

(Continued)

FOREIGN PATENT DOCUMENTS

EP  1081771  3/2001

(Continued)

*Primary Examiner*—Luan Thai
(74) *Attorney, Agent, or Firm*—Fay Sharpe LLC

(57) ABSTRACT

A light emitting package (8, 8', 8", 208, 408) includes a printed circuit board (10, 10', 10", 210, 410) supporting at least one light emitting die (12, 12", 14, 16, 212, 412). A light transmissive cover (60, 60', 60", 260, 460) is disposed over the at least one light emitting die. The cover has an open end defining a cover perimeter (62, 62', 62", 262, 462) connected with the printed circuit board. An inside surface of the cover together with the printed circuit board defines an interior volume (70, 70", 270, 470) containing the at least one light emitting die. An encapsulant (76, 76", 276, 278, 476) is disposed in the interior volume and covers at least the light emitting die.

38 Claims, 6 Drawing Sheets

U.S. PATENT DOCUMENTS

| | | | |
|---|---|---|---|
| 6,504,301 B1 | 1/2003 | Lowery | |
| 6,522,065 B1 | 2/2003 | Srivastava et al. | |
| 6,538,371 B1 | 3/2003 | Duggal et al. | |
| 6,541,800 B2 * | 4/2003 | Barnett et al. | 257/98 |
| 6,578,986 B2 | 6/2003 | Swaris et al. | |
| 6,600,175 B1 | 7/2003 | Baretz et al. | |
| 6,610,563 B1 * | 8/2003 | Waitl et al. | 438/166 |
| 6,621,211 B1 | 9/2003 | Srivastava et al. | |
| 6,635,987 B1 | 10/2003 | Wojnarowski et al. | |
| 6,642,618 B2 | 11/2003 | Yagi et al. | |
| 6,657,379 B2 | 12/2003 | Ellens et al. | |
| 6,670,748 B2 | 12/2003 | Ellens et al. | |
| 6,674,233 B2 | 1/2004 | Ellens et al. | |
| 6,683,325 B2 | 1/2004 | Waitl et al. | |
| 6,746,885 B2 * | 6/2004 | Cao | 438/26 |
| 6,812,503 B2 | 11/2004 | Lin et al. | |
| 6,817,783 B2 * | 11/2004 | Lee et al. | 385/93 |
| 6,850,001 B2 * | 2/2005 | Takekuma | 313/501 |
| 6,871,981 B2 * | 3/2005 | Alexanderson et al. | 362/294 |
| 7,029,935 B2 | 4/2006 | Negley et al. | |
| 2001/0000622 A1 | 5/2001 | Reeh et al. | |
| 2002/0043926 A1 | 4/2002 | Takahashi et al. | |
| 2002/0079506 A1 | 6/2002 | Komoto et al. | |
| 2002/0080501 A1 | 6/2002 | Kawae et al. | |
| 2002/0084745 A1 | 7/2002 | Wang et al. | |
| 2002/0084748 A1 | 7/2002 | Ayala et al. | |
| 2002/0117676 A1 | 8/2002 | Katoh | |
| 2002/0158578 A1 | 10/2002 | Eliashevich et al. | |
| 2002/0163006 A1 | 11/2002 | Yoganandan et al. | |
| 2003/0038291 A1 | 2/2003 | Cao | |
| 2003/0039119 A1 | 2/2003 | Cao | |
| 2003/0039120 A1 | 2/2003 | Cao | |
| 2003/0067265 A1 | 4/2003 | Srivastava et al. | |
| 2003/0107046 A1 | 6/2003 | Waitl et al. | |
| 2003/0141563 A1 | 7/2003 | Wang | |
| 2003/0146690 A1 | 8/2003 | Ellens et al. | |
| 2004/0000867 A1 | 1/2004 | Chen | |
| 2004/0012027 A1 | 1/2004 | Keller et al. | |
| 2004/0051111 A1 | 3/2004 | Ota et al. | |
| 2004/0056256 A1 | 3/2004 | Bplpr et al. | |
| 2004/0227149 A1 * | 11/2004 | Ibbetson et al. | 257/100 |
| 2004/0256630 A1 * | 12/2004 | Cao | 257/98 |

FOREIGN PATENT DOCUMENTS

| | | |
|---|---|---|
| EP | 1191608 | 3/2002 |
| EP | 1220332 A2 | 7/2002 |
| EP | 1220332 A3 | 7/2002 |
| JP | 10-282916 | 10/1998 |
| JP | P2000-22216 A | 1/2000 |
| JP | 2000-123620 | 4/2000 |
| JP | 2000-156526 | 6/2000 |
| JP | 2000-164012 | 6/2000 |
| JP | 2001-035239 | 2/2001 |
| JP | 2001-243807 | 9/2001 |
| JP | 2001-243809 | 9/2001 |
| JP | 2001-274463 | 10/2001 |
| JP | 2002-141558 | 5/2002 |
| JP | 2002-150821 | 5/2002 |
| JP | 2002-261328 | 9/2002 |
| JP | 2002-304902 | 10/2002 |
| JP | 2003-023183 | 1/2003 |
| JP | 2003-037298 | 2/2003 |
| JP | 2003-110150 | 4/2003 |
| JP | 2003-110151 | 4/2003 |
| JP | 2003-206481 | 7/2003 |
| JP | 2003-206482 | 7/2003 |
| JP | 2003-224306 | 8/2003 |
| WO | WO 02/089175 | 11/2002 |
| WO | WO 02/091489 | 11/2002 |

* cited by examiner

LIGHT EMITTING DIODE COMPONENT

This application is a continuation-in-part of International Application number PCT/US2003/027363 with an international filing date of Aug. 29, 2003 first published Mar. 11, 2004 as International Publication no. WO 2004/021461 A2, which claims the benefit of U.S. Provisional Application Ser. No. 60/407,426 filed on Aug. 30, 2002. This application incorporates by reference the content of International Application number PCT/US2003/027363. This application also incorporates by reference the content of U.S. Provisional Application Ser. No. 60/407,426.

BACKGROUND

The present invention relates to the lighting arts. It especially relates to single-chip and multiple-chip light emitting diode components and methods for making same, and will be described with particular reference thereto. However, the invention applies to light emitting packages generally, and is applicable in packaging monolithic light emitting diode array dice, edge-emitting laser dice, vertical cavity light emitting dice or monolithic laser array dice, organic light emitting devices or organic light emitting array devices, and the like. The inventive light emitting packages and components will find application in substantially any application that employs one or more light sources.

Light emitting diode components provide illumination in small, rugged, reliable packages. Light emitting diodes have been developed in many colors spanning the visible spectrum and extending into the infrared and ultraviolet. While each light emitting diode typically emits light in a narrow spectral range, primary color light emitting diodes can be combined to emit white light. In another approach for generating white light, light from a blue, violet, or ultraviolet light emitting diode is coupled with a suitable phosphor to produce white light. Other colors can similarly be generated by suitable selection of light emitting die components, phosphors, and combinations of die components and phosphors.

One issue with light emitting diode components or packages relates to light output intensity. Early light emitting diodes had low light output intensities and were generally not competitive with incandescent and fluorescent light sources. Improvements in crystal growth, device fabrication, packaging methods, phosphor materials, and the like have substantially improved the light output intensities of modern light emitting diode packages. However, improvements in light output intensities are still being sought.

Another issue with light emitting diode components and packages relates to ruggedness. Commonly used packaging techniques, such as bonding of the dice to lead frames, can produce relatively fragile light emitting packages. Moreover, light emitting diode components and packages tend to be complex. A typical single-chip package may include, for example, a light emitting diode die, a lead frame, an encapsulant disposed over the light emitting diode die and a portion of the lead frame, and a phosphor embedded in the encapsulant.

Multiple chip packages generally further increase complexity. One example of such a multiple chip package is disclosed in Lowery, U.S. Pat. No. 6,504,301, which shows various arrangements involving generally wire-bonded interconnection of a plurality of light emitting dice disposed on a support placed in a housing including a cylindrical casing and a fluorescent plate. A similar multiple chip package is disclosed in Baretz et al., U.S. Pat. No. 6,660,175. Baretz discloses a phosphor contained in an encapsulant disposed inside the housing. The complexity of multiple chip packages such as those of Lowery and Baretz can adversely impact manufacturability, reliability, and manufacturing costs.

Yet another issue with typical light emitting diode packages and components is operating lifetime. Performance of packages employing phosphor wavelength conversion of ultraviolet or short-wavelength visible light typically degrades over time due to discoloration or other degradation of the encapsulant or other materials caused by the ultraviolet or short-wavelength visible light irradiation.

The present invention contemplates improved apparatuses and methods that overcome the above-mentioned limitations and others.

BRIEF SUMMARY

According to one aspect, a light emitting package is disclosed. A printed circuit board supports at least one light emitting die and has at least two electrical terminals. Printed circuitry of the printed circuit board connects the at least one light emitting die with the at least two electrical terminals to provide power thereto. A light transmissive cover is disposed over the at least one light emitting die but not over the at least two electrical terminals. The cover has an open end defining a cover perimeter connected with the printed circuit board. An inside surface of the cover together with the printed circuit board defines an interior volume containing the at least one light emitting die. An encapsulant is disposed in the interior volume and covers at least the light emitting die.

According to another aspect, a light emitting package is disclosed. A support has at least one light emitting die disposed thereon. A glass cover is disposed on the support over the at least one light emitting die. The glass cover and the support cooperatively define an interior volume containing the at least one light emitting die. An encapsulant is disposed in the interior volume and encapsulates the at least one light emitting die.

According to another aspect, a light emitting package is disclosed. A support has at least one light emitting die disposed thereon. A single piece light transmissive cover is disposed on the support over the at least one light emitting die. The single piece cover and the support cooperatively define a substantially closed interior volume containing the at least one light emitting die. An encapsulant is disposed in the interior volume and encapsulates the at least one light emitting die.

According to yet another aspect, a method is provided for making a light emitting package. At least one light emitting die is electrically and mechanically connected to a printed circuit board. A light transmissive cover is secured to the printed circuit board. The light transmissive cover covers the at least one light emitting die. The secured light transmissive cover and the printed circuit board cooperatively define an interior volume. An encapsulant is disposed in the interior volume.

According to still yet another aspect, a method is provided for disposing of a phosphor on a surface. An adhesive is disposed on the surface. A phosphor powder is applied to the adhesive. The adhesive is hardened.

Numerous advantages and benefits of the present invention will become apparent to those of ordinary skill in the art upon reading and understanding the present specification.

BRIEF DESCRIPTION OF THE DRAWINGS

The invention may take form in various components and arrangements of components, and in various process operations and arrangements of process operations. The drawings are only for purposes of illustrating preferred embodiments and are not to be construed as limiting the invention.

In FIG. 6, a portion of the phosphorized light transmissive cover is removed to show some of the light emitting dice or chips and other internal components.

In FIG. 7, a portion of the phosphorized light transmissive cover removed to show internal elements of the lighting package.

In FIG. 9, a portion of the phosphorized light transmissive cover removed to show internal elements of the lighting package.

DETAILED DESCRIPTION OF PREFERRED EMBODIMENTS

Figure 1:
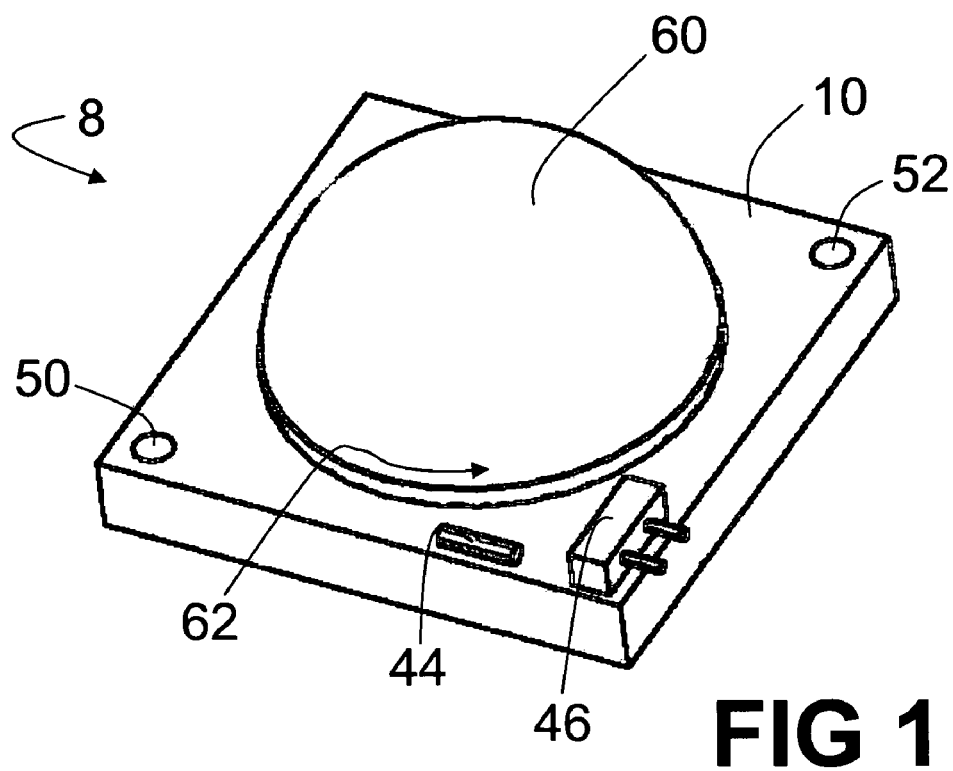
FIG. 1 shows a perspective view of a lighting component or package.
Figure 2:
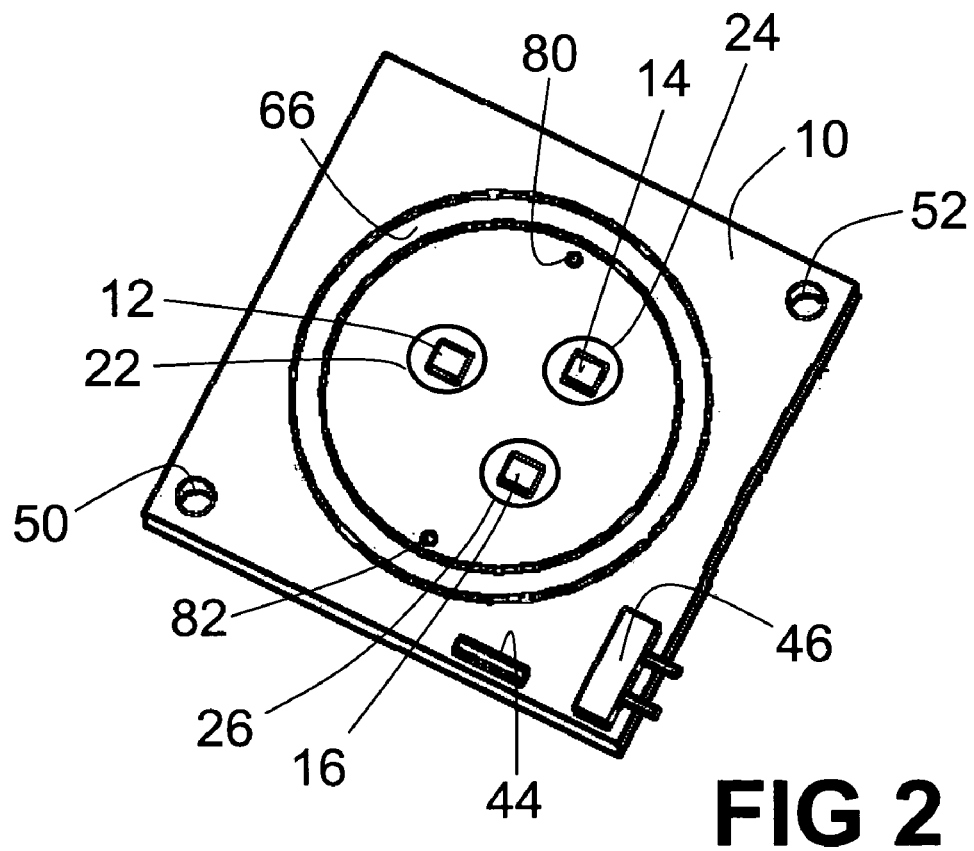
FIG. 2 shows a perspective view of the printed circuit board of the lighting package of FIG. 1 with the light emitting dice or chips and associated electrical components disposed thereon.
Figure 3:
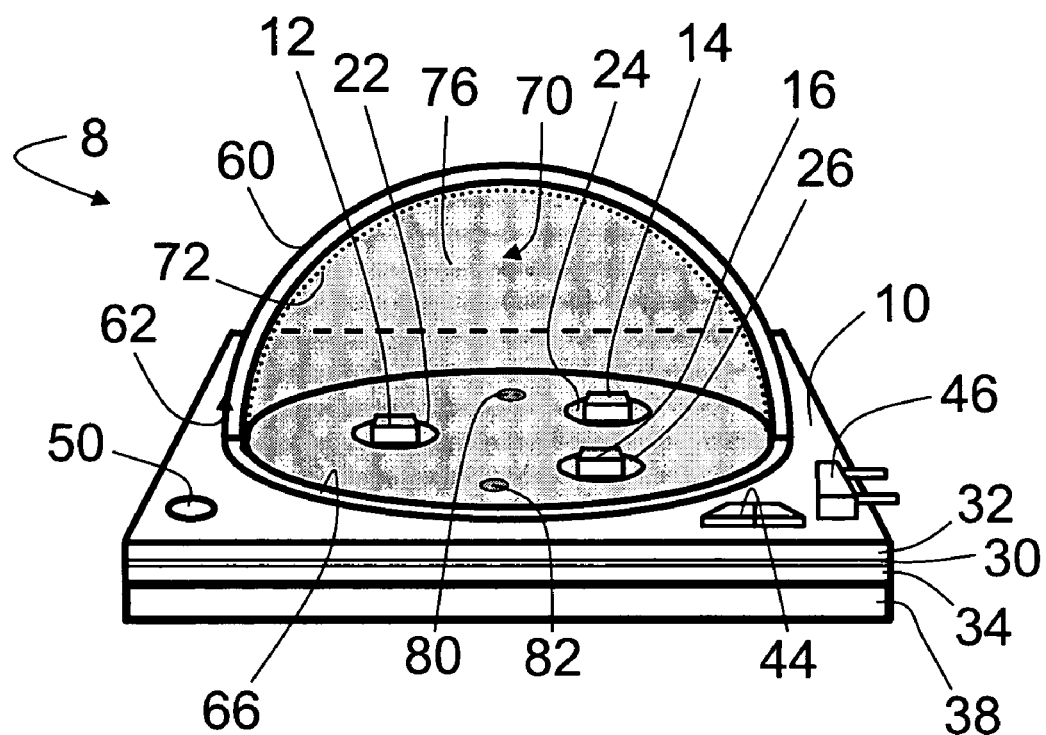
FIG. 3 shows a perspective view of the lighting component or package of FIG. 1 with a portion of the phosphorized light transmissive cover removed to show internal elements of the lighting package.

With reference to FIGS. 1–3, a light emitting package 8 includes a printed circuit board 10 on which one or more light emitting chips or die are disposed. The printed circuit board is preferably substantially thermally conductive. For example, a metal core printed circuit board can be employed. In the illustrated embodiment, three light emitting chips or dice 12, 14, 16 are disposed on the circuit board 10; however, the number of dice can be one die, two dice, or more than three dice. The die or dice can be group III-nitride blue or ultraviolet light emitting diodes, red group III-phosphide or group III-arsenide light emitting diodes, II–VI light emitting diodes, IV–VI light emitting diodes, silicon or silicon-germanium light emitting diodes, or the like. In some contemplated embodiments, the die or dice are edge emitting lasers or vertical cavity surface emitting lasers. The light emitting chips or dice can also be organic light emitting diodes or devices. Each light emitting die or dice can be a bare die, or each die or dice can include an individual encapsulant. Still further, the die or dice can be a monolithic array of light emitting diode mesas, vertical cavity surface emitting laser mesas, or the like. In the illustrated embodiment, the dice 12, 14, 16 are disposed in corresponding reflective wells 22, 24, 26; however, the die or dice may be mounted on a planar surface of the printed circuit board 10 or can be mounted on raised pedestals or other elevated support structures. In some embodiments, a portion or all of the side of the printed circuit board 10 on which the light emitting dice or chips 12, 14, 16 are disposed has a reflective layer disposed thereon to improve light extraction from the package 8.

With particular reference to FIG. 3, the illustrated printed circuit board 10 includes one or more printed circuitry layers 30 sandwiched between insulative layers 32, 34. Typically, electrical pads are formed on the die attach surface of the printed circuit board 10 using appropriate vias passing through the insulative layer 32 to electrically connect the dice 12, 14, 16 with the printed circuitry 30. The die or dice 12, 14, 16 can be mechanically and electrically attached to the printed circuit board 10 in various ways, such as: by flip-chip bonding of die electrodes to electrical pads of the printed circuit board 10; by soldering the die to the board 10 and using wire bonds to electrically connect the die electrodes with electrical pads of the printed circuit board 10; by soldering the die to a lead frame (not shown) that is in turn mounted to the printed circuit board 10; or so forth. The die attachment can include a sub-mount (not shown) disposed between a light emitting die or chip and the printed circuit board or other support, or between the chip and a lead frame. Still further, rather than mounting individual dice as illustrated herein, it is contemplated to employ a monolithic light emitting diode array formed on a common substrate. In this contemplated embodiment, the common substrate is soldered or otherwise secured to the printed circuit board 10, and electrical connection to the individual light emitting mesas or structures is made by wire bonding, conductive traces formed on the common substrate, or the like. Alternatively, a monolithic array having a transparent common substrate can be configured for a flip-chip mounting in which the electrodes of the light emitting mesas or structures are directly bonded to electrical pads.

The printed circuit board 10 preferably further includes a heat sinking structure such as a ground plate or metal core 38 to provide heat sinking of the light emitting chips or dice 12, 14, 16. Optionally, an insulative back-plate (not shown) is disposed on the side of the metal core 38 distal from the die attach surface. The heat sink is optionally omitted in lower power lighting packages, packages mounted on a heat sinking surface, or the like. Moreover, the printed circuitry layer or layers 30 may provide adequate heat sinking in some embodiments. In still yet other embodiments, the material or materials forming the insulative layers 32, 34 are chosen to be thermally conductive so that these layers provide heat sinking.

The printed circuit board 10 optionally supports associated electrical components, such as a zener diode component 44 including one or more zener diodes connected across the light emitting dice 12, 14, 16 by the printed circuitry 30 to provide electrostatic discharge protection for the dice. Similarly, electrical power conversion circuitry, power regulating circuitry, rectifying circuitry, or the like, can be included as additional components on the printed circuit board 10. Such components can be provided as one or more discrete components, or as an application-specific integrated circuit (ASIC). Moreover, an electrical plug, adaptor, electrical terminals 46, or the like can be disposed on the printed circuit board 10. In some embodiments, it is contemplated to include more than one set of electrical terminals, for example to enable series, parallel, or series-parallel interconnection of a plurality of light emitting packages. The printed circuitry 30 includes traces connecting the electrical terminals 46 with the light emitting dice or chips 12, 14, 16 such that suitable electrical power applied to the electrical terminals 46 energizes the light emitting dice or chips 12, 14, 16 and associated circuitry (if any) such as the zener diode component 44. The printed circuit board 10 can include other features such as a mounting socket, mounting openings 50, 52 or the like for mechanically installing or securing the light emitting package 8.

The described printed circuit board 10 is an example. Other types of printed circuit boards or other support structures can also be employed. For example, the printed circuit traces can be disposed on the die attach surface and/or on the bottom surface rather than being sandwiched between insulative layers 32, 34. Thus, for example, the printed circuit board can be an electrically insulating support with a conductive trace evaporated and patterned or otherwise formed on the insulating support. Moreover, a heat sink can be substituted for the printed circuit board, for example with the light emitting die or dice soldered or otherwise mechanically secured to the heat sink and with the die electrodes wire bonded to electrical pads.

With continuing reference to FIGS. 1–3, the light emitting package 8 further includes a light transmissive cover 60 disposed over the light emitting dice or chips 12, 14, 16. The light transmissive cover has an open end defining a cover perimeter 62 that connects with the printed circuit board 10. In the illustrated embodiment, the printed circuit board 10 includes an optional annular groove 66 that receives the perimeter 62 of the light transmissive cover 60, which in the light emitting package 8 is a hemispherical dome-shaped cover. The groove 66 guides in positioning the cover 60 on the printed circuit board 10, and optionally also is used to help secure the cover to the board. In some embodiments the annular groove 66 is omitted, in which case the placement of the cover 60 on the printed circuit board 10 is positioned by other means, such as by using an automated assembly jig.

The light transmissive cover 60 can be secured to the printed circuit board 10 in various ways, such as by an adhesive, by a friction fit between the perimeter 62 and the groove 66, by fasteners, or so forth. The light transmissive cover 60 together with the printed circuit board 10 define an interior volume 70 containing the light emitting dice or chips 12, 14, 16. In some embodiments, the connection between the perimeter 62 of the light transmissive cover 60 and the printed circuit board 10 is a substantially airtight sealing connection that substantially hermetically seals the interior volume 70. In other embodiments, the connection between the perimeter 62 and the printed circuit board 10 is not a hermetic seal, but rather may contain one or more gaps, openings, or the like.

A phosphor 72 (indicated by a dotted line in FIG. 3) is optionally disposed on an inside surface of the cover 60. If provided, the phosphor is selected to produce a desired wavelength conversion of a portion or substantially all of the light produced by the light emitting dice or chips 12, 14, 16. The term "phosphor" is to be understood as including a single phosphor compound or blends of two or more chemically distinct individual compounds chosen to produce a selected wavelength conversion. Examples of suitable phosphor compounds are provided in Table I. Those skilled in the art can readily select other phosphors suitable for performing specific light conversions. In one embodiment, the light emitting dice or chips 12, 14, 16 are blue, violet, or ultraviolet emitters such as group III-nitride light emitting diodes, and the phosphor 72 converts most or substantially all of the light generated by the chips 12, 14, 16 into white light. In another embodiment the light emitting dice or chips 12, 14, 16 are blue light emitters such as group III-nitride light emitting diodes, and the phosphor 72 is a yellow phosphor that converts some of the blue light into yellow light wherein direct blue light and indirect yellow phosphor-generated light combine to produce white light. In yet another embodiment the light emitting dice or chips 12, 14, 16 are blue, violet, or ultraviolet emitters and the phosphor 72 converts most or substantially all of the emitted light into light of a selected color, such as green, yellow, red, or so forth, so that the light emitting package 8 produces a colored light. These are examples only, and substantially any conversion of light produced by the light emitting dice or chips 12, 14, 16 can be performed by suitable selection of light emitting dice or chips 12, 14, 16 outputting at a selected wavelength and suitable selection of the phosphor 72. In some embodiments, the phosphor 72 is omitted and the direct light produced by the light emitting diodes 12, 14, 16 is the light output of the light emitting package.

In some embodiments, the light transmissive cover 60 is a glass cover, where "glass" is not limited to silica-based materials but rather encompasses substantially any inorganic, amorphous light transmissive material. Making the cover 60 of glass has certain advantages over plastic or other organic covers. Glass typically has better thermal stability than most plastics. Glass is more readily coated with optical coatings such as wavelength-selective reflective coatings, wavelength-selective absorbing coatings, or the like. Glass is also typically more resistant to scratching compared with most plastics. Moreover, glass has particular advantages in embodiments in which the light emitting dice or chips 12, 14, 16 produce ultraviolet or short-wavelength visible light, because light at these wavelengths can discolor or otherwise degrade the optical quality of light transmissive plastics over time. In other embodiments, the light transmissive cover 60 is made of plastic or another organic light transmissive material. In yet other contemplated embodiments, the cover 60 is made of a crystalline light transmissive material such as crystalline quartz. Such crystalline covers typically share many of the advantages of glass covers.

Moreover, the printed circuit board 10 can include various reflective coatings or reflective surfaces for improving light extraction efficiency. In some embodiments, substantially the entire surface of the printed circuit board on which the light emitting dice or chips 12, 14, 16 and the cover 60 are disposed is reflective for both light produced by the light emitting chips and for light produced by the phosphor 72. In other embodiments, that portion or area of the printed circuit board surface covered by the cover 60 is reflective for both light produced by the light emitting chips and for light produced by the phosphor 72, while that portion or area of the printed circuit board surface outside of the cover 60 is reflective principally for light produced by the phosphor 72. These latter embodiments are suitable when substantially all of the direct light produced by the light emitting dice or chips 12, 14, 16 is converted by the phosphor, so that the output light is substantially entirely due to the phosphor. By using different reflective coatings or surfaces inside of and outside of the cover 60, each reflective coating or surface can be independently optimized for the spectrum of light which it is intended to reflect.

It will be appreciated that the term "light transmissive" as used herein to describe the cover 60 refers to the desired light output produced by the light emitting package 8. The light output includes light generated by the phosphor 72, if present, responsive to irradiation by the light emitting dice or chips 12, 14, 16. In some embodiments, the light output includes a portion or all of the direct light produced by the light emitting dice or chips 12, 14, 16. Examples of the latter embodiments are a white light in which the white output light is a blending of blue light emitted by the light emitting dice or chips 12, 14, 16 and yellow light emitted by the phosphor 72, or embodiments in which the phosphor 72 is omitted entirely. Where the direct light produced by the light emitting dice or chips 12, 14, 16 contributes to the output light, the cover 60 should be at least partially light transmissive for that direct light. In embodiments where the output light is solely produced by the phosphor 72, on the other hand, the cover 60 may be light transmissive for the phosphor output but partially or wholly reflective or absorbing for the direct light produced by the light emitting dice or chips 12, 14, 16. An example of such a light emitting package is a white light emitting package in which the output white light is produced by the phosphor 72 responsive to violet or ultraviolet light produced by the light emitting dice or chips 12, 14, 16.

The phosphor 72 can be applied to the inside surface of the light transmissive cover 60 using a suitable phosphor coating process, such as for example, electrostatic coating, slurry coating, spray coating, or so forth. Moreover, the phosphor can be disposed elsewhere besides on the inside surface of the cover 60. For example, the phosphor can be applied to the outside surface of the cover 60, using for example spray coating, outer surface coating, or the like, or to both the inside and outside surfaces of the cover 60. In yet another embodiment, the phosphor is embedded in the material of the light transmissive cover 60. However, phosphor is not readily embedded into most glass or crystalline materials. In some embodiments the phosphor is disposed in a glass binder that is spun onto or otherwise coated onto the inside and/or outside surface of the cover 60.

In one suitable phosphorization process, the inside surface of the cover 60 is prepared by treatment with a liquid or low viscosity semi-solid material acting as a glue. The liquid material can be, for example, liquid epoxy or silicone. The glue material can be applied in a variety of ways, such as by spraying, brushing, or dipping of its working formulation or a solution thereof in a suitable solvent such as acetone or methyl isobutyl ketone (MIBK). The phosphor is then deposited by dusting, dipping or pouring of phosphor in powder form, the choice of deposition method being based on the nature of the inside surface of the cover 60. For example, pour phosphor powder is suitably poured into the concave inside surface of the cover 60. On the other hand, dipping is generally a better method for coating the outside surface of the cover 60. The glue is then hardened by solvent evaporation, thermal or UV curing, or the like to form the phosphor layer.

TABLE I

Example phosphor compounds

| Phosphor Color | Powder Material |
|---|---|
| Blue | $(Sr,Ca,Ba,Mg)_{10}(PO_4)_6(F,Cl,Br,OH)$: $Eu^{2+}$ (SECA); |
| | $(Ba,Sr,Ca)MgAl_{10}O_{17}$: $Eu^{2+}$ (BAM); |
| | $(Sr,Ca)_{10}(PO4)_6*nB_2O_3$: $Eu^{2+}$; |
| | $2SrO*0.84P_2O_5*0.16B_2O_3$: $Eu^{2+}$; |
| | $Sr_2Si_3O_8*2SrCl_2$: $Eu^{2+}$; |
| | $Ba_3MgSi_2O_8$: $Eu^{2+}$; |
| | $Sr_4Al_{14}O_{25}$: $Eu^{2+}$ (SAE); |
| | $BaAl_8O_{13}$: $Eu^{2+}$; |
| Green | $(Ba,Sr,Ca)MgAl_{10}O_{17}$: $Eu^{2+}$,$Mn^{2+}$ (BAM-Mn); |
| | $(Ba,Sr,Ca)Al_2O_4$: $Eu^{2+}$; |
| | $(Y,Gd,Lu,Sc,La)BO_3$: $Ce^{3+}$, $Tb^{3+}$; |

TABLE I-continued

Example phosphor compounds

| Phosphor Color | Powder Material |
|---|---|
| | $Ca_8Mg(SiO_4)_4Cl_2$: $Eu^{2+}$; $Mn^{2+}$; |
| | $(Ba,Sr,Ca)_2SiO_4$: $Eu^{+2}$; |
| | $(Ba,Sr,Ca)_2(Mg,Zn)Si_2O_7$: $Eu^{2+}$; |
| | $(Sr,Ca,Ba)(Al,Ga,In)_2S_4$: $Eu^{2+}$; |
| | $(Y,Gd,Tb,La,Sm,Pr, Lu)_3(Al,Ga)_5O_{12}$: $Ce^{3+}$; |
| | $(Ca,Sr)_8(Mg,Zn)(SiO_4)_4Cl_2$: $Eu^{2+}$, $Mn^{2+}$ (CASI); |
| | $Na_2Gd_2B_2O_7$: $Ce^{3+}$, $Tb^{3+}$ |
| | $(Ba,Sr)2(Ca,Mg,Zn)B_2O_6$: K,Ce,Tb |
| Orange-yellow | $(Sr,Ca,Ba,Mg,Zn)_2P_2O_7$: $Eu^{2+}$, $Mn^{2+}$ (SPP); |
| | $(Ca,Sr,Ba,Mg)_{10}(PO_4)_6(F,Cl,Br,OH)$: $Eu^{2+}$, $Mn^{2+}$ (HALO); |
| | $(Y,Tb,Gd,Ce)_3(Al,Ga,In)_5O_{12}$ |
| Red | $(Gd,Y,Lu,La)_2O_3$: $Eu^{3+}$, $Bi^{3+}$; |
| | $(Gd,Y,Lu,La)_2O_2S$: $Eu^{3+}$, $Bi^{3+}$; |
| | $(Gd,Y,Lu,La)VO_4$: $Eu^{3+}$, $Bi^{3+}$; |
| | $(Ca,Sr)S$: $Eu^{2+}$; |
| | $SrY_2S_4$: $Eu^{2+}$; |
| | $CaLa_2S_4$: $Ce^{3+}$; |
| | $(Ca,Sr)S$: $Eu^{2+}$; |
| | $3.5MgO*0.5MgF2*GeO_2$: $Mn_4$ + (MEG); |
| | $(Ba,Sr,Ca)MgP_2O_7$: $Eu^{2+}$, $Mn^{2+}$; |
| | $(Y,Lu)_2WO_6$: $Eu^{3+}$, $Mo^{6+}$; |
| | $(Sr,Ca,Ba)_3MgSi_2O_8$: $Eu^{2+}$, $Mn^{2+}$ |

Repetitions or various combinations of the above-described example phosphor deposition and hardening processes may be performed, for example to deposit more than one phosphor or a blend of phosphors, or as needed to attain a required thickness or layered structure. Optionally, the phosphor coating may be covered with a final layer of clear glue or other suitable material to provide mechanical protection, to filter out ambient ultraviolet light or excess radiation from the light emitting dice 12, 14, 16, or so forth.

The light transmissive cover 60 optionally includes one or more optical coatings besides the phosphor 72. In some embodiments, an anti-reflective coating is applied to the inside and/or outside surface of the cover 60 to promote light transmission. In embodiments in which the direct light produced by the light emitting dice or chips 12, 14, 16 does not form part of the output light, the light transmissive cover 60 optionally includes a wavelength-selective reflective coating to reflect the direct light back into the interior volume 70 where it has additional opportunity to interact with the phosphor 72.

In preferred embodiments, the light transmissive cover 60 is a single piece cover, such as a single piece glass cover, a single piece molded plastic cover, or the like. Manufacturing the cover 60 as a single piece simplifies assembly of the lighting package 8. Another advantage of a single piece cover 60 is that a substantially hermetic sealing of the interior volume 70 is obtained by ensuring a substantially hermetic seal between the perimeter 62 of the cover 60 and the printed circuit board 10. The light transmissive cover 60 can include facets, fresnel lens contours, or other light refractive features that promote light scattering to produce a more spatially uniform light output. Similarly, the light transmissive cover 60 can be made of a frosted glass that has been etched with sand or the like to produce light scattering.

With particular reference to FIG. 3, the interior volume 70 is, in the lighting package 8, substantially filled with an encapsulant 76. The encapsulant 76 can be, for example, a silicone encapsulant, an epoxy encapsulant, or the like. The encapsulant 76 is transparent to light produced by the light emitting dice or chips 12, 14, 16 and acts as a refractive index-matching material promoting light extraction out of the light emitting dice or chips 12, 14, 16, and preferably also promoting light coupling with the phosphor 72 and, if the direct light produced by the light emitting dice 12, 14, 16 directly contributes to the package light output, also preferably promotes light transmission into the cover 60.

In some embodiments, the phosphor is dispersed in a binding material that is the same material as the encapsulant 76. In other embodiments the phosphor-binding material is a different material that has a good refractive index match with the encapsulant 76. In yet other embodiments, the encapsulant 76 serves as the binding material for the phosphor 72. It will be appreciated that while the phosphor 72 is shown in FIG. 3 as residing substantially along the inside surface of the cover 60, in some embodiments the phosphor 72 may extend some distance away from the inside surface of the cover 60 and into the encapsulant 76 disposed in the interior volume 70. In some contemplated embodiments, the phosphor is dispersed substantially into the encapsulant 76, and may even be uniformly distributed throughout the encapsulant 76. However, as described in International Publication WO 2004/021461 A2, there are efficiency advantages to spatially separating the phosphor from the light emitting dice or chips. Hence, in preferred embodiments the phosphor is disposed on the inside surface of the cover 60, or is disposed closer to the cover 60 than to the light emitting dice or chips 12, 14, 16.

In embodiments in which the light emitting dice or chips 12, 14, 16 are bare dice, that is, are not individually encapsulated, the encapsulant 76 provides a common encapsulation of the light emitting dice or chips 12, 14, 16 which protects the chips from damage due to exposure to moisture or other detrimental environmental effects. The encapsulant 76 may also provide potting of the light emitting dice or chips 12, 14, 16 to improve the robustness of the lighting package 8 and make the lighting package 8 more resistant to damage from vibrations or other mechanical disturbances.

In some embodiments the cover 60 is sealed to the printed circuit board 10, and the encapsulant 76 is injected into the interior volume 70 after the light transmissive cover is sealed. To enable encapsulant injection, openings 80, 82 are provided in the printed circuit board 10 Alternatively, openings can be provided in the light transmissive cover or at the interface between the perimeter of the cover and the printed circuit board. At least two such openings 80, 82 are preferably provided, so that while encapsulant material is injected into one opening displaced air can exit via another opening. In other embodiments, a single elongated or otherwise enlarged opening is used to provide room for both the inflowing encapsulant and the outflowing displaced air.

In embodiments in which the interior volume 70 is substantially hermetically sealed, the injected encapsulant 76 can be a liquid or non-rigid semi-solid encapsulant that is contained by the hermetically sealed interior volume 70. The liquid or non-rigid semi-solid encapsulant may be left uncured in some embodiments, since the hermetic seal prevents leakage of the encapsulant. Moreover, a hermetic seal optionally allows the encapsulant to be injected under some pressure, so that the encapsulant is at a pressure higher than atmospheric pressure. In some embodiments, the interior volume 70 is not hermetically sealed, and some of the injected encapsulant material may leak out. It will be appreciated that for encapsulant material of reasonably high viscosity, the amount of leaked encapsulant material is limited, and such leaked encapsulant material may even be advantageous insofar as it may help seal the interior volume 70 when the injected encapsulant is cured or otherwise hardened into a solid.

Figure 4:
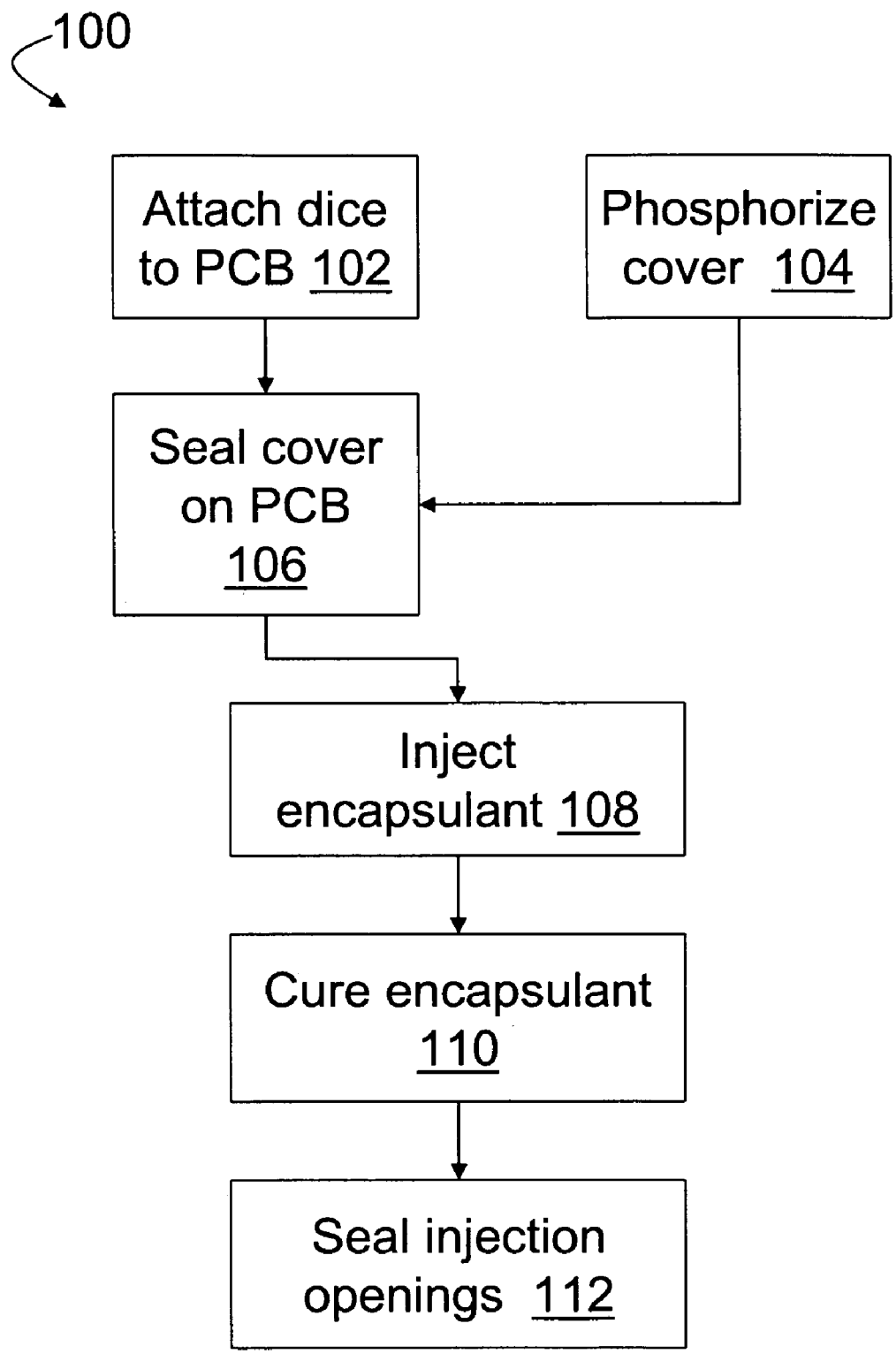
FIG. 4 diagrams an example process for manufacturing the lighting package of FIG. 1.

With continuing reference to FIGS. 1–3 and with further reference to FIG. 4, an example process 100 for manufacturing the lighting package 8 is described. The light emitting dice or chips 12, 14, 16 are mechanically and electrically connected with the printed circuit board 10 in a die attach process 102. The die attach can involve flip chip bonding, soldering, wire bonding, or so forth. Separately, the inside surface (and/or optionally the outside surface) of the light transmissive cover 60 is coated with the phosphor 72, if such phosphor is included in the package 8, in a phosphorizing process 104. In embodiments in which the cover has the phosphor embedded therein, the phosphorizing process 104 is omitted and instead the phosphor is incorporated during molding or other formation of the cover 60. The cover is then secured, optionally sealed, to the printed circuit board 10 in a sealing process 106. The sealing process 106 defines the interior volume 70, which is optionally a hermetically sealed volume. The encapsulant 76 is then injected into the interior volume 70 through the openings 80, 82 in an encapsulant injection process 108. The encapsulant is cured in a curing process 110 if the encapsulant material requires curing. After injection and optional curing of the encapsulant 76, the openings 80, 82 are optionally sealed with a suitable sealing material in a sealing process 112. In some embodiments, the encapsulant 76 also seals the openings 80, 82, and so in these embodiments the separate sealing process 112 is omitted.

Figure 5:
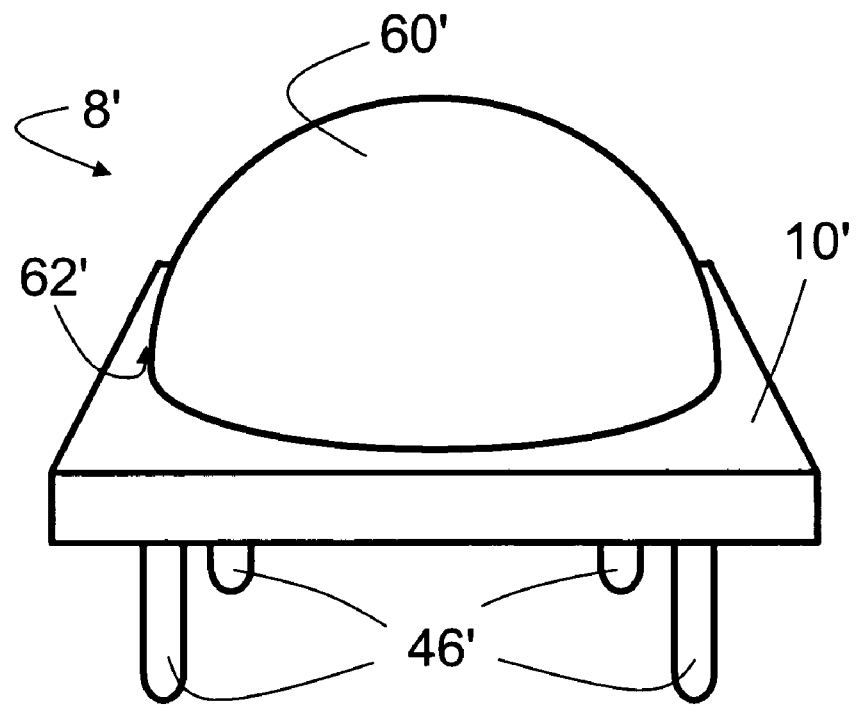
FIG. 5 shows a perspective view of another lighting component or package having backside electrical terminals.

With reference to FIG. 5, another lighting package 8' includes a printed circuit board 10' and a light transmissive cover 60' having an open end defining a cover perimeter 62', which are illustrated in FIG. 5 and correspond to the printed circuit board 10, cover 60, and cover perimeter 62', respectively, of the lighting package 8. The lighting package 8' also includes most other components of the lighting package 8 which however are not visible in the outside perspective view of FIG. 5. The lighting package 8' differs from the lighting package 8 of FIGS. 1–3 in that the electrical terminals 46 of the lighting package 8 are replaced in the lighting package 8' by four electrical terminals 46' disposed on the backside of the printed circuit board 10'. The electrical terminals 46' are electrically connected with the light emitting die or dice disposed in the cover 60' by suitable printed circuitry residing in or on the printed circuit board 10'. The backside electrical terminals 46' can be configured, for example, to insert into matching openings of a four-prong surface-mount receptacle socket.

Figure 6:
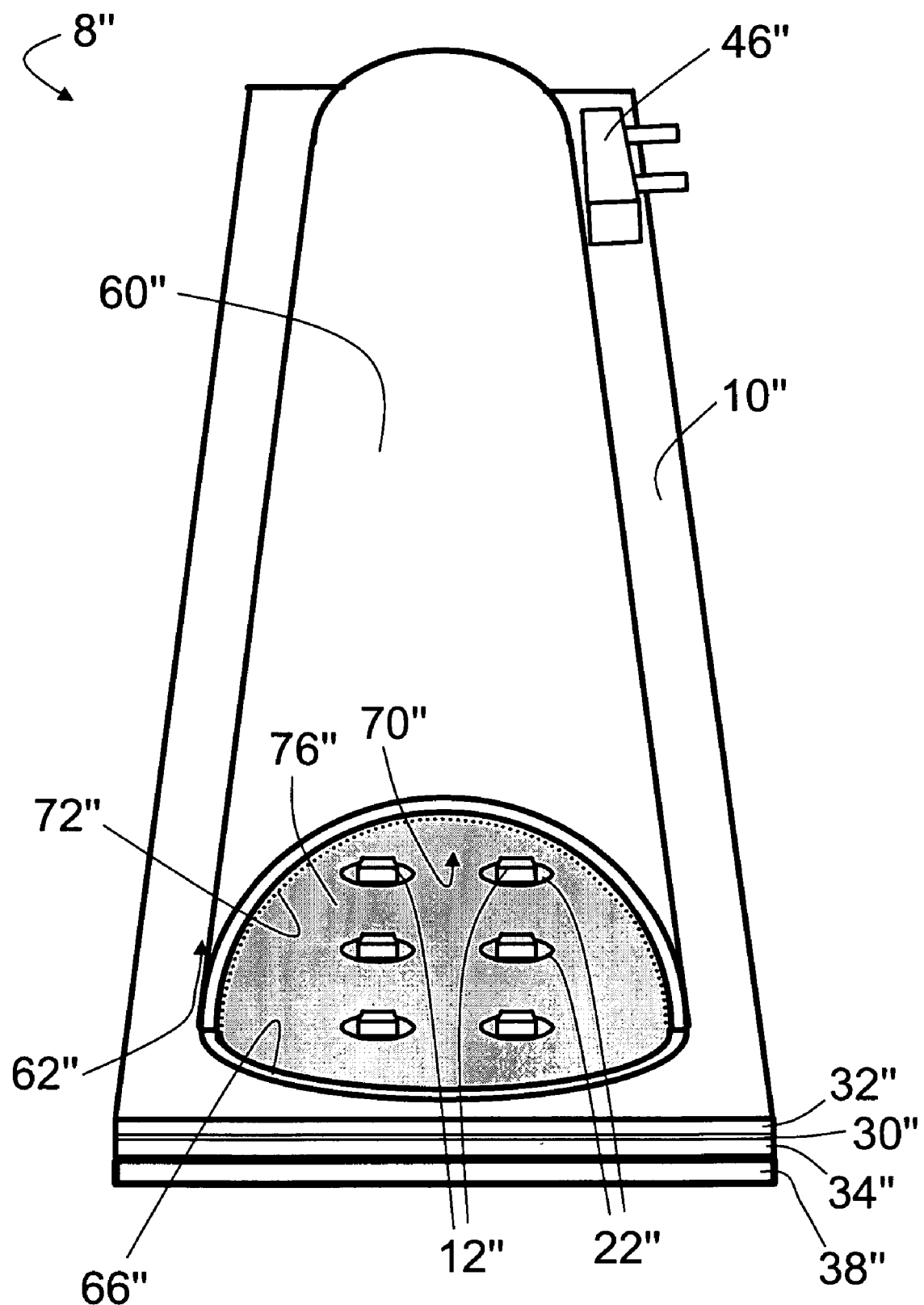
FIG. 6 shows a perspective view of another lighting component or package having light emitting chips arranged in a long double-row.

With reference to FIG. 6, another lighting package 8" includes a printed circuit board 10", having a long strip shape, on which a plurality of light emitting dice or chips 12" are arranged in reflective wells 22" in a double-row arrangement along the board strip. The printed circuit board 10" includes one or more printed circuitry layers 30" sandwiched between insulative layers 32", 34", and a ground plate or metal core 38". Electrical terminals 46" disposed on the printed circuit board 10" deliver electrical power to the light emitting dice or chips 12" via the printed circuitry 30". A light transmissive cover 60" is tube-shaped to cover the long double-row of light emitting dice or chips 12" and has an open end defining a perimeter 62" that is received by a matching groove 66" formed in the printed circuit board 10". The tube-shaped cover 60" together secured to the printed circuit board 10" define an elongated or tubular interior volume 70" containing the light emitting dice or chips 12". A phosphor 72" optionally coats an inside surface of the tube-shaped cover 60". An encapsulant 76" substantially fills the interior volume 70" to encapsulate and pot the light emitting dice or chips 12" and the optional phosphor 72".

Figure 7:
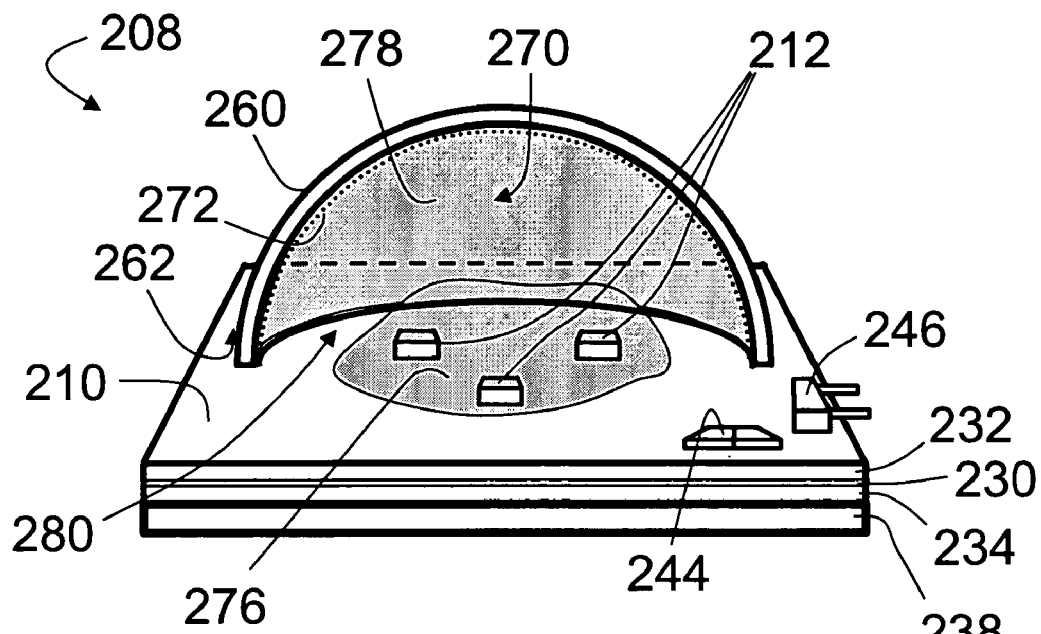
FIG. 7 shows a perspective view of yet another lighting component or package, in which the light emitting dice and the phosphor are encapsulated by separate encapsulants.

With reference to FIG. 7, yet another lighting package 208 includes a printed circuit board 210 on which one or more (specifically three in the illustrated embodiment) light emitting dice or chips 212 are arranged. In the lighting package 208, the light emitting dice or chips 212 are not disposed in reflective wells; rather, they are surface-mounted to a level surface of the printed circuit board 210. The printed circuit board 210 includes one or more printed circuitry layers 230 sandwiched between insulative layers 232, 234, and a ground plate or metal core 238. A zener diode component 244 provides electrostatic discharge protection for the light emitting dice or chips 212. Electrical terminals 246 disposed on the printed circuit board 210 deliver electrical power to the light emitting dice or chips 212 via the printed circuitry 230. A light transmissive cover 260 covers the light emitting dice or chips 212 and has an open end defining a perimeter 262 that is connected with the printed circuit board 210 to define an interior volume 270 containing the light emitting dice or chips 212. A phosphor 272 optionally coats an inside surface of the light transmissive cover 260. The above-described elements of the lighting component or package 208 are similar to corresponding elements of the lighting component or package 8 shown in FIGS. 1–3.

The lighting package 208 differs from the lighting package 8 in the configuration of the encapsulant disposed in the interior volume. In the lighting package 208, a first encapsulant 276 encapsulates and optionally pots the light emitting dice or chips 212, but does not substantially fill the interior volume 270. In some embodiments, the first encapsulant 276 may encapsulate only the one or more light emitting dice 212. A second encapsulant 278 encapsulates the phosphor 272 if such a phosphor is included in the package 208. In some embodiments, the second encapsulant 278 is the binding material of the phosphor 270. For example, the phosphor 272 may be applied to the inside surface of the cover 260, and the encapsulant in this embodiment is the binding material of the applied phosphor. Generally, the first and second encapsulants 276, 278 can be different materials. A substantial gap 280 extends between the first and second encapsulants 276, 278. Typically, the gap 280 contains air; however, it is also contemplated to fill the gap 280 with an inert gas to reduce moisture in the lighting package 208. In yet another embodiment, the gap 280 is filled with a third encapsulant different from at least one of the first and second encapsulants 276, 278. In the lighting package 208, there is no groove in the printed circuit board 210 for receiving the perimeter 262 of the cover 260. However, such a groove similar to the groove 66 of the lighting package 8 can optionally be provided to align and optionally help secure the cover 260 to the printed circuit board 210.

Figure 8:
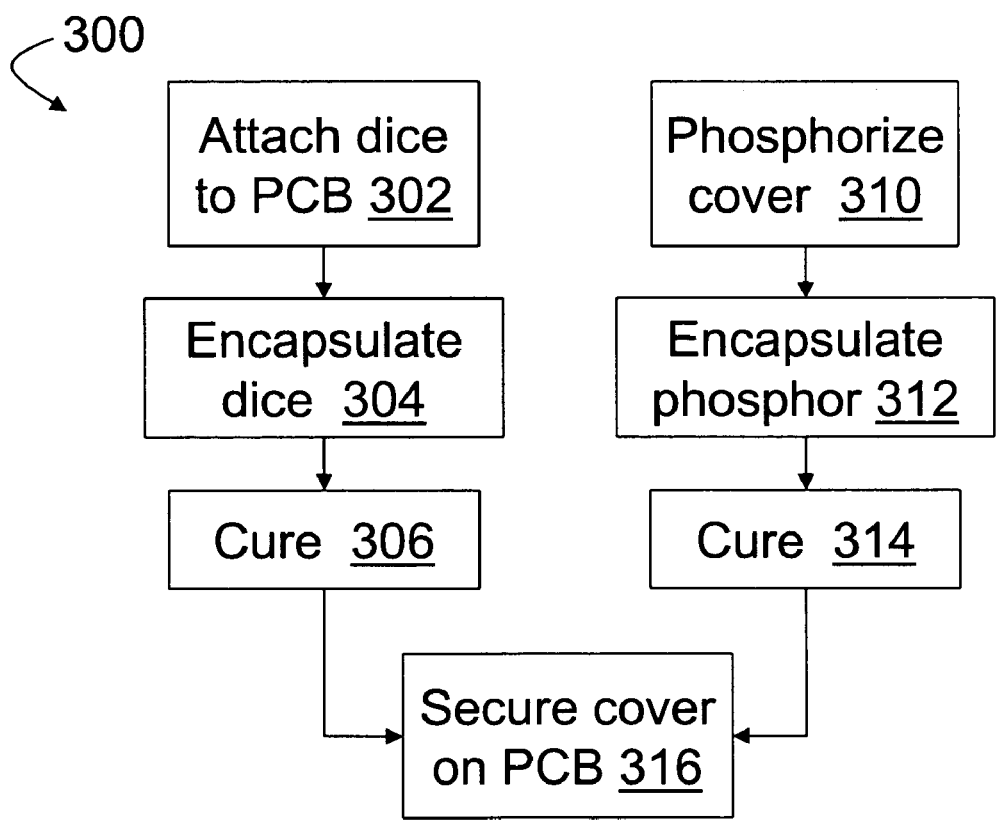
FIG. 8 diagrams an example process for manufacturing the lighting package of FIG. 7.

With continuing reference to FIG. 7 and with further reference to FIG. 8, an example process 300 for manufacturing the lighting package 208 is described. The light emitting dice or chips 212 are mechanically and electrically connected with the printed circuit board 210 in a die attach process 302. The die attach can involve flip chip bonding, soldering, wire bonding, or so forth. The attached light emitting dice 212 are encapsulated or potted on the printed circuit board 210 in a first encapsulation process 304, and the first encapsulant 276 is cured in a first curing process 306 applied to the printed circuit board 210.

Separately, the inside surface (and/or optionally the outside surface) of the light transmissive cover 260 is coated with the phosphor 272 in a phosphorizing process 310. In embodiments in which the cover has the phosphor embedded therein, the phosphorizing process 310 is omitted and instead the phosphor is incorporated during molding or other formation of the cover 260. The phosphor is encapsulated on the light transmissive cover 260 in a second encapsulation process 312, and the second encapsulant 278 is cured in a second curing process 314 applied to the light transmissive cover 314. If the phosphor 272 is omitted from the package 208, then process 310, 312, and 314 are suitably omitted. In some embodiments the second encapsulant 278 is the binding material of the phosphor 272; in these embodiments, the phosphorization process 310 and the second encapsulation process 312 are integrated. The light transmissive phosphorized cover is then secured, optionally sealed, to the printed circuit board 210 in a securing process 316. The securing process 316 defines the interior volume 270, which is optionally a hermetically sealed volume.

Figure 9:
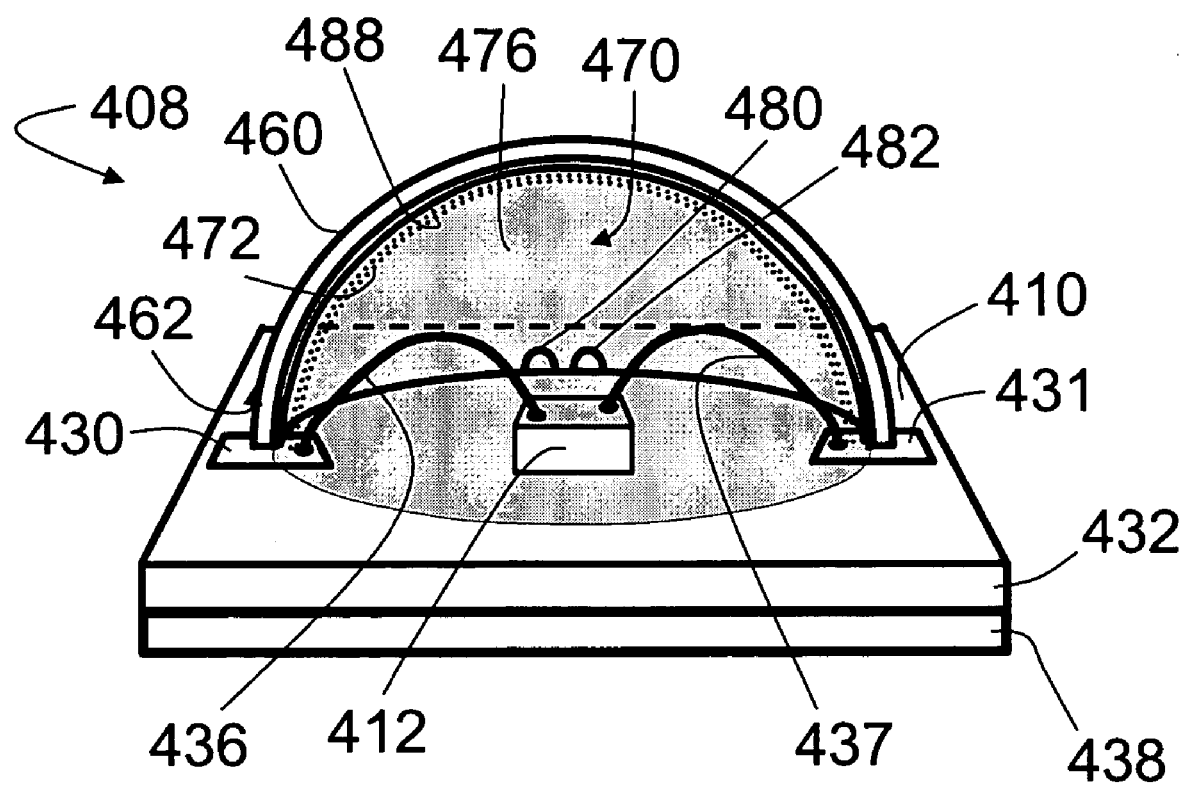
FIG. 9 shows a perspective view of still yet another lighting component or package, in which the printed circuit board includes two evaporated conductive traces.

With reference to FIG. 9, still yet another lighting package 408 includes a printed circuit board 410 on which a single light emitting die or chip 412 is surface-mounted to a level surface of the printed circuit board 410. The printed circuit board 410 includes two printed circuit traces 430, 431 disposed on the same surface as the light emitting die 412. The two conductive traces 430, 431 can be formed by metal evaporation or the like. Wire bonds 436, 437 connect top-side electrodes of the light emitting die or chip 412 with the conductive traces 430, 431. The printed circuit board includes an insulative layer 432 on which the two printed circuit traces 430, 431 are formed, and an optional ground plate or metal core 438. A light transmissive cover 460 covers the light emitting die or chip 412 and has an open end defining a perimeter 462 that is connected with the printed circuit board 410 to define an interior volume 470 containing the light emitting die or chip 412. The two printed circuit traces 430, 431 extend from inside the cover 460 to outside the cover 460 to provide electrical communication into the interior volume 470. A phosphor 472 optionally coats an inside surface of the light transmissive cover 460, and an encapsulant 476 substantially fills the interior volume 470. Hemispherical openings 480, 482 formed at the perimeter 462 of the light transmissive cover 460 allow for injection of the encapsulant material and corresponding displacement of air. That is, the openings 480, 482 of the lighting package 408 serve the same purpose as the printed circuit board openings 80, 82 of the lighting package 8 (see FIG. 3).

With continuing reference to FIG. 9, a reflective coating 488 coats the inside surface of the light transmissive cover. The reflective coating 488 is substantially reflective for light produced by the light emitting die or chip 412 but is substantially transmissive for light produced by the phosphor 472 responsive to illumination by the light emitting die or chip 412. In the lighting package 408, the phosphor 472 is disposed on the reflective coating 488 and extends some distance into the encapsulant 476.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

The appended claims follow:

The invention claimed is:

1. A light emitting package comprising:
   a printed circuit board supporting at least one light emitting die and having at least two electrical terminals, printed circuitry of the printed circuit board connecting the at least one light emitting die with the at least two electrical terminals to provide power thereto;

a light transmissive cover disposed over the at least one light emitting die but not over the at least two electrical terminals, the cover having an open end defining a cover perimeter connected with the printed circuit board, an inside surface of the cover together with the printed circuit board defining an interior volume containing the at least one light emitting die;

an encapsulant disposed in and at least substantially filling the interior volume and covering the at least one light emitting die; and a phosphor disposed proximate to the light transmissive cover and remote from the at least one light emitting die, the encapsulant that at least substantially fills the interior volume promoting light coupling between the at least one light emitting die and the remote phosphor.

2. The light emitting package as set forth in claim 1, wherein the at least one light emitting die and the electrical terminals are disposed on opposite sides of the printed circuit board.

3. The light emitting package as set forth in claim 1, wherein at least two openings communicate with the interior volume, the openings being formed into at least one of: (i) the printed circuit board, (ii) the light transmissive cover, and (iii) a connection between the cover perimeter and the printed circuit board.

4. The light emitting package as set forth in claim 3, wherein the openings are filled with one of: (i) a portion of the encapsulant, and (ii) a filling material.

5. The light emitting package as set forth in claim 1, wherein the interior volume is substantially hermetically sealed by the connection between the cover perimeter and the printed circuit board.

6. The light emitting package as set forth in claim 1, wherein the encapsulant comprises:
   a liquid encapsulant contained in the interior volume by the connection of the cover perimeter and the printed circuit board.

7. The light emitting package as set forth in claim 1, further comprising:
   an adhesive disposed between the cover perimeter and the printed circuit board to secure the cover perimeter and the printed circuit board.

8. The light emitting package as set forth in claim 1, wherein the printed circuit board includes a groove receiving the cover perimeter.

9. The light emitting package as set forth in claim 1, wherein the printed circuit board comprises:
   a metal core printed circuit board providing heat sinking for the at least one light emitting die.

10. The light emitting package as set forth in claim 1, wherein the phosphor is disposed on an outside surface of the light transmissive cover.

11. The light emitting package as set forth in claim 1, wherein the phosphor is embedded in the light transmissive cover.

12. The light emitting package as set forth in claim 1, wherein the encapsulant is at a pressure higher than atmospheric pressure.

13. The light emitting package as set forth in claim 1, wherein the light transmissive cover is a dome-shaped cover.

14. A light emitting package comprising:
   a printed circuit board that is substantially planar, supports at least one light emitting die, and has at least two electrical terminals, printed circuitry of the printed circuit board connecting the at least one light emitting die with the at least two electrical terminals to provide power thereto;

a light transmissive cover disposed over the at least one light emitting die but not over the at least two electrical terminals, the cover having an open end defining a cover perimeter connected with the printed circuit board, an inside surface of the cover together with the printed circuit board defining an interior volume containing the at least one light emitting die;

an encapsulant disposed in and at least substantially filling the interior volume and covering the at least one light emitting die; and a phosphor disposed proximate to the light transmissive cover and remote from the at least one light emitting die, the encapsulant that at least substantially fills the interior volume promoting light coupling between the at least one light emitting die and the remote phosphor.

15. The light emitting package as set forth in claim 14, wherein the printed circuit board includes at least one reflective well corresponding to the at least one light emitting die, each light emitting die being disposed inside of the corresponding reflective well.

16. A light emitting package comprising:
   a printed circuit board supporting at least one light emitting die and having at least two electrical terminals, printed circuitry of the printed circuit board connecting the at least one light emitting die with the at least two electrical terminals to provide power thereto;

a light transmissive glass cover disposed over the at least one light emitting die but not over the at least two electrical terminals, the glass cover having an open end defining a cover perimeter connected with the printed circuit board, an inside surface of the glass cover together with the printed circuit board defining an interior volume containing the at least one light emitting die;

an encapsulant disposed in and at least substantially filling the interior volume and covering the at least one light emitting die; and a phosphor disposed proximate to the light transmissive glass cover and remote from the at least one light emitting die, the encapsulant that at least substantially fills the interior volume promoting light coupling between the at least one light emitting die and the remote phosphor.

17. The light emitting package as set forth in claim 16, wherein the phosphor is disposed on the inside surface of the cover.

18. The light emitting package as set forth in claim 17, further comprising:
   an optical coating disposed between the phosphor and the inside surface of the cover.

19. The light emitting package as set forth in claim 16, wherein the encapsulant comprises:
   a silicone encapsulant at least substantially filling the interior volume.

20. The light emitting package as set forth in claim 16, further comprising:
   an optical coating disposed on a surface of the glass cover, the optical coating reflecting or absorbing light produced by the at least one light emitting die and substantially transmitting light produced by the phosphor.

21. The light emitting package as set forth in claim 20, wherein the phosphor is disposed on the optical coating.

22. The light emitting package as set forth in claim 20, wherein the phosphor is disposed in a portion of the encapsulant distal from the at least one light emitting die and proximate to the glass cover.

23. The light emitting package as set forth in claim 16, wherein the glass cover is one of dome-shaped and tube-shaped.

24. The light emitting package as set forth in claim 16, wherein the printed circuit board is a generally planar printed circuit board and the glass cover includes a generally planar perimeter secured to the generally planar printed circuit board.

25. The light emitting package as set forth in claim 16, wherein the glass cover includes a perimeter substantially hermetically sealed to the printed circuit board.

26. The light emitting package as set forth in claim 16, wherein the light transmissive glass cover is a dome-shaped glass cover.

27. A light emitting package comprising:
a printed circuit board supporting at least one light emitting die and having at least two electrical terminals, printed circuitry of the printed circuit board connecting the at least one light emitting die with the at least two electrical terminals to provide power thereto;
a light transmissive cover disposed over the at least one light emitting die but not over the at least two electrical terminals, the cover having an open end defining a cover perimeter connected with the printed circuit board, an inside surface of the cover together with the printed circuit board defining an interior volume containing the at least one light emitting die;
an encapsulant disposed in and at least substantially filling the interior volume and covering the at least one light emitting die; and
a phosphor disposed proximate to the light transmissive cover and remote from the at least one light emitting die, the phosphor being distributed in a portion of the encapsulant distal from the at least one light emitting die and proximate to the light transmissive cover, the encapsulant that at least substantially fills the interior volume promoting light coupling between the at least one light emitting die and the remote phosphor.

28. A light emitting package comprising:
a printed circuit board supporting at least one light emitting die and having at least two electrical terminals, printed circuitry of the printed circuit board connecting the at least one light emitting die with the at least two electrical terminals to provide power thereto;
a light transmissive cover disposed over the at least one light emitting die but not over the at least two electrical terminals, the cover having an open end defining a cover perimeter connected with the printed circuit board, an inside surface of the cover together with the printed circuit board defining an interior volume containing the at least one light emitting die;
an encapsulant disposed in and at least substantially filling the interior volume and covering the at least one light emitting die; and
a phosphor disposed proximate to the light transmissive cover and remote from the at least one light emitting die, the encapsulant that at least substantially fills the interior volume promoting light coupling between the at least one light emitting die and the remote phosphor;
wherein a surface of the printed circuit board disposed inside the light transmissive cover is reflective for light emitted by the at least one light emitting die and for light emitted by the phosphor, and a surface of the printed circuit board disposed outside the light transmissive cover is reflective for light emitted by the phosphor.

29. A light emitting package comprising:
a printed circuit board supporting a plurality of bare light emitting dice and having at least two electrical terminals, printed circuitry of the printed circuit board connecting the plurality of bare light emitting dice with the at least two electrical terminals to provide power thereto;
a light transmissive cover disposed over the plurality of bare light emitting dice but not over the at least two electrical terminals, the cover having an open end defining a cover perimeter connected with the printed circuit board, an inside surface of the cover together with the printed circuit board defining an interior volume containing the plurality of bare light emitting dice;
an encapsulant disposed in and at least substantially filling the interior volume and covering the plurality of bare light emitting dice such that the bare light emitting dice are commonly encapsulated by the encapsulant and do not include separate encapsulation; and
a phosphor disposed proximate to the light transmissive cover and remote from the plurality of bare light emitting dice, the encapsulant that at least substantially fills the interior volume promoting light coupling between the plurality of bare light emitting dice and the remote phosphor.

30. The light emitting package as set forth in claim 29, wherein the light transmissive cover is a
a single-piece light transmissive cover made of a light-transmissive material disposed on the printed circuit board over the plurality of light emitting dice.

31. The light emitting package as set forth in claim 30, wherein at least two openings communicate with the interior volume, the openings being formed into at least one of: (i) the printed circuit board, (ii) the light transmissive cover, and (iii) an interface between the light transmissive cover and the printed circuit board.

32. The light emitting package as set forth in claim 30, wherein the encapsulant is one of a liquid encapsulant and a non-rigid semi-solid encapsulant that is contained by the interior volume defined by the cooperating single-piece cover and printed circuit board to prevent leakage of the encapsulant out of the interior volume.

33. The light emitting package as set forth in claim 30, wherein the printed circuit board includes a reflective coating.

34. The light emitting package as set forth in claim 30, wherein the printed circuit board includes a heat sinking core.

35. The light emitting package as set forth in claim 30, wherein the single-piece light transmissive cover comprises:
an inorganic amorphous light transmissive cover.

36. The light emitting package as set forth in claim 29, wherein the light transmissive cover is a dome-shaped cover.

37. The light emitting package as set forth in claim 30, wherein the single-piece light transmissive cover is a dome-shaped cover.

38. A light emitting package comprising:
a printed circuit board supporting at least one light emitting die and having at least two electrical terminals, the at least one light emitting die being flip-chip bonded to the printed circuitry of the printed circuit board, the printed circuitry connecting the at least one light emitting die with the at least two electrical terminals to provide power thereto;
a light transmissive cover disposed over the at least one light emitting die but not over the at least two electrical terminals, the cover having an open end defining a cover perimeter connected with the printed circuit board, an inside surface of the cover together with the printed circuit board defining an interior volume containing the at least one light emitting die;

an encapsulant disposed in and at least substantially filling the interior volume and covering the at least one light emitting die; and a phosphor disposed proximate to the light transmissive cover and remote from the at least one light emitting die, the encapsulant that at least substantially fills the interior volume promoting light coupling between the at least one light emitting die and the remote phosphor.

* * * * *